United States Patent [19]

Fukuyama et al.

[11] 4,207,464
[45] Jun. 10, 1980

[54] PHOTOELECTRIC SWITCH

[75] Inventors: Toshifumi Fukuyama; Norio Onji, both of Nagaokakyo, Japan

[73] Assignee: Omron Tateisi Electronics Co., Nagaokakyo, Japan

[21] Appl. No.: 890,516

[22] Filed: Mar. 27, 1978

[30] Foreign Application Priority Data

Mar. 26, 1977 [JP] Japan .................................. 52-33667
Mar. 26, 1977 [JP] Japan .................................. 52-36943

[51] Int. Cl.² .............................................. H01J 5/02
[52] U.S. Cl. .................................................. 250/239
[58] Field of Search ................ 250/216, 221, 227, 239

[56] References Cited

U.S. PATENT DOCUMENTS

| | | | |
|---|---|---|---|
| 3,758,782 | 9/1973 | Radford et al. | 250/227 |
| 3,842,257 | 10/1974 | Kohler | 250/221 |
| 4,021,665 | 5/1977 | Haas et al. | 250/239 |
| 4,051,365 | 9/1977 | Fukuyama et al. | 250/239 |

Primary Examiner—David C. Nelms
Attorney, Agent, or Firm—Stevens, Davis, Miller & Mosher

[57] ABSTRACT

A photoelectric switch comprising a circuit block which is housed within a fluid-tight enclosure.

The enclosure comprises a box-like housing having a first opening at one end, a second opening at another end and a cap means closing the first opening and fixed to the housing. The circuit block comprising a circuit board and a plurality of circuit elements, is placed in the enclosure through the first opening. A light-source element and a light-responsive element are positioned in the cap means and electrically connected to the circuit board.

A conductor is electrically connected to the circuit board and extends out of the enclosure through the second opening.

9 Claims, 5 Drawing Figures

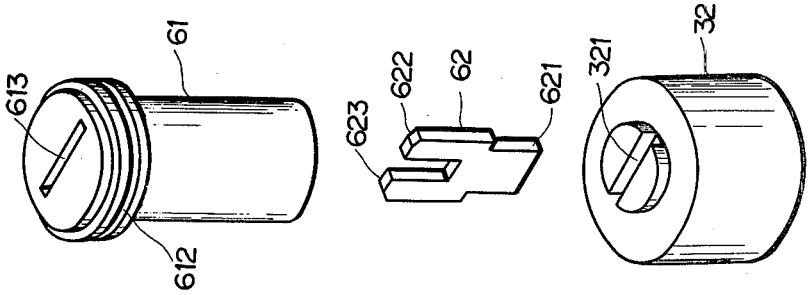
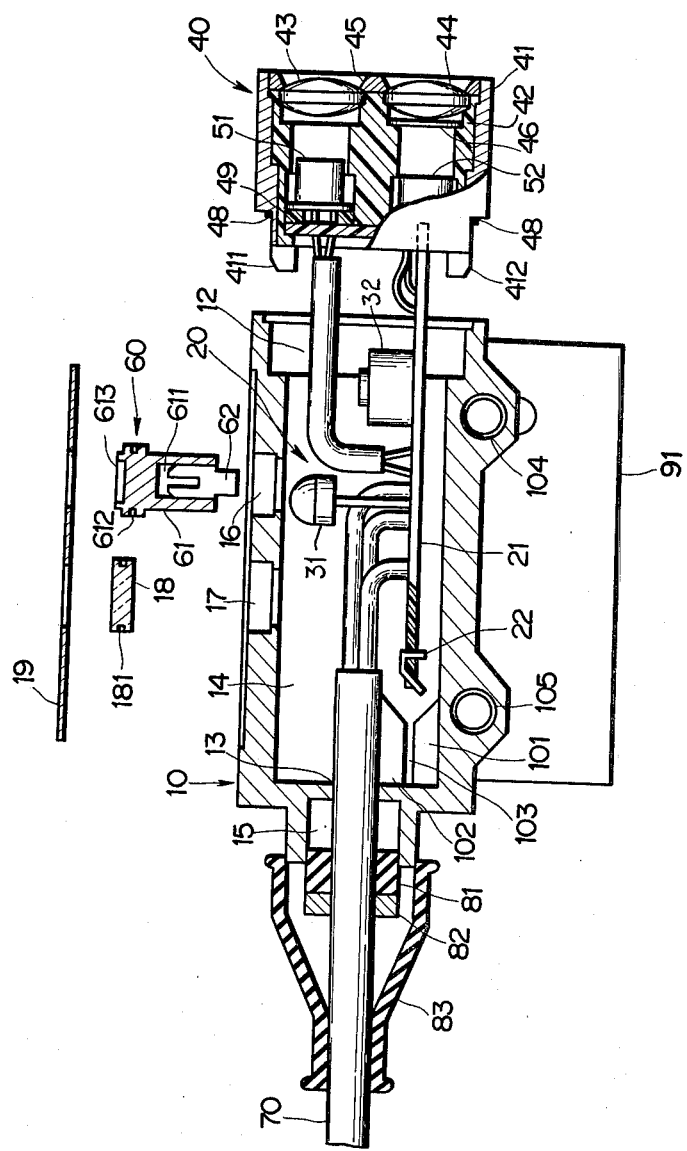

PHOTOELECTRIC SWITCH

BACKGROUND OF THE INVENTION

This invention relates to a photoelectric switch.

A variety of photoelectric switches, namely photoelectric detectors, are known that utilize a light source element, such as a light-emitting diode, and a light responsive element, such as a photoelectric transistor, for detecting the presence or absence of an article in the light path between said two elements. Such two elements are securely accommodated in a common housing or each of them is housed in an independent housing and in each case, the housing is generally made of metal or opaque plastic material and has a window means made of a glass or plastic material which is transparent to light.

Such prior art switches are, however, complex in construction and, therefore, expensive to fabricate.

It should be understood that the term "photoelectric switch" is used herein to refer not only to a device comprising both a light source element and a light responsive element in a common housing but also to a device including either a light source element or a light responsive element in a housing. Similarly, the term "light" is used herein to refer to any radiant electromagnetic energy within the far infrared to ultraviolet regions of the spectrum, including, but not limited to, visible light.

It is an object of this invention to provide a photoelectric switch which is compact, simple in construction and easy to fabricate at low cost.

Another object of this invention is to provide a photoelectric switch wherein circuit elements are housed in a fluid-tight enclosure.

A further object of this invention is to provide a photoelectric switch comprising an adjusting means for adjusting its operation characteristics.

BRIEF DESCRIPTION OF THE DRAWINGS

FIG. 3 and FIG. 4 are partially sectional schematic views of the same switch; and FIG. 5 is a diagrammatic perspective view of an adjusting means employed in the same switch.

DESCRIPTION OF THE PREFERRED EMBODIMENTS

Figure 1:
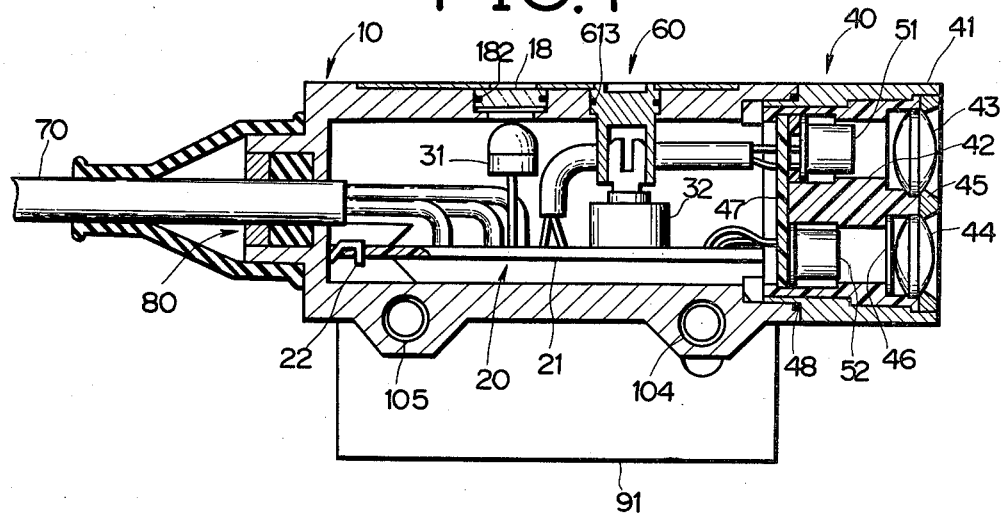
FIG. 1 is a longitudinal sectional view showing a photoelectric switch of this invention.
Figure 2:
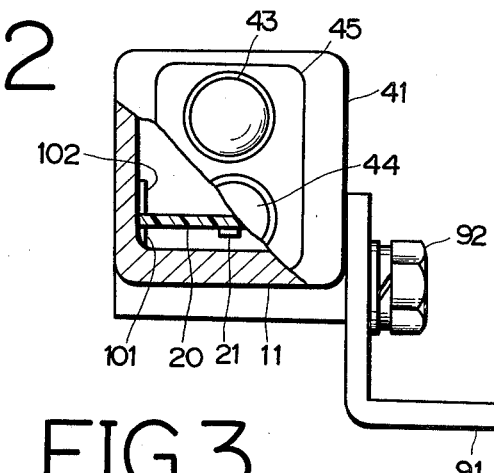
FIG. 2 is a front elevation view, in partial section, of the same photoelectric switch as shown in FIG. 1.

Referring to FIG. 1 and FIG. 2, there is shown a completed photoelectric switch of this invention. Disposed in an consisting of a box-like or cylindrical housing 10 made of metal, e.g. aluminum, or opaque plastic, and a cap member 40 is a circuit block which comprises a circuit board 21 and circuit elements. The circuit board 21 is fixed to the cap member 40 which, in turn, is removably fixed to one end of housing 10. A conductor 70 is fixed to another end of housing 10 by fixing member 80 and extends out of housing 10. The conductor 70 is electrically connected to the circuit board 21. Mounted on the circuit board 21 are an indicator 31 such as a light-emitting diode for indicating operation of the switch and a variable resistor 32 for adjusting operation level of the switch. Other circuit elements, namely an element for producing drive pulses which are to be applied to a light-source element 51 such as a light-emitting diode for emitting infrared light and an element for producing output signals on reception of light by a light-responsive element 52 such as a photoelectric transistor are omitted from the drawings.

A light-source element 51 and a light-responsive element 52 are positioned in said cap member 40. The cap member 40 is provided with a window means which consists of two lenses 43 and 44, both made of glass or clear plastic material, each of the lenses being aligned with the light-source element 43 or light-responsive element 44 as the case may be. An optical filter 46 is positioned between lens 44 and light-responsive element 52. When the lens 44 is made of a material having the required optical characteristics, filter 46 may be omitted.

When the light-source element 51 and/or light-responsive element 52 has its own lens system, the window means may be a plain transparent plate. Both the light-source element 51 and the light-responsive element 52 are electrically connected to circuit board 21.

An adjusting means 60 is rotatably supported by a side-wall of housing 10. One end of adjusting means 60 is engaged with variable resistor 32 so that variable resister 32 may be rotated with adjusting means 60. A mounting means 91 for mounting the switch on a desired surface is fixed to said housing 10 by two screws 92 screwed into threaded holes 104, 105.

Figure 3:
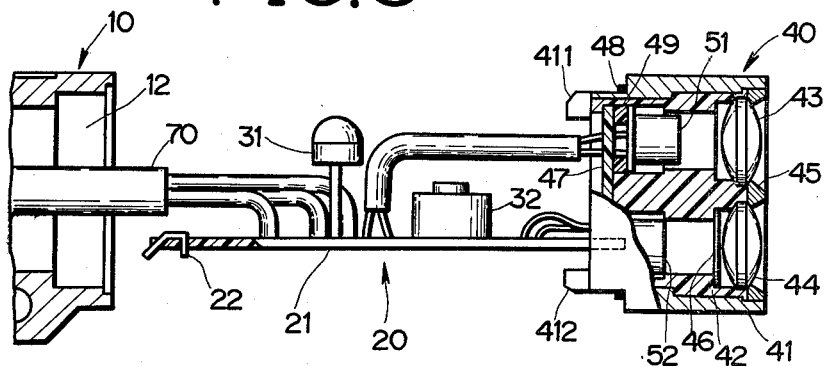

Disticntive features and advantages of the above-described unique construction of the switch of this invention will become more apparent from the following detailed description when taken together with FIG. 3 through FIG. 5 which show a fabricating process. Light-source element 51 and light-responsive element 52 are attached to a supporting board 47. The supporting board, e.g. made of synthetic resin, is attached to a plastic frame 42, for example by interference fitting. The plastic frame 42 is inserted into metal frame 41 and rigidly fixed thereto, again by interference fitting. The optical filter 46 and lens 43 or 44 are secured in position at the front of the plastic frame 42 by means of a fixing frame 45 of metal, cement being then applied to the joint for a fluid-tight seal. If desired, frames 41 and 42 may be molded in one-piece from a resin material, and window means of plastic material may be welded thereto by ultrasonic welding. Circuit elements, including indicator 31, variable resistor 32 and other elements (not shown), are mounted on the circuit board 21 to provide a circuit block 20. The circuit board 21 of circuit block 20 is secured to metal frame 41 of cap member 40 by inserting projections of circuit board 21 into holes of metal frame 41, as shown in FIG. 3 and FIG. 4 by dotted lines. Electrically connected to the circuit board 21 are the light-source element 51, light-responsive element 52, and conductor 70. The conductor 70 extends out of housing 10. The housing 10 is provided with a hole 17, in addition to through-hole 16, in its side-wall. A window 18 is mounted in hole 17 with a sealing ring 182. The above semi-assembly comprising cap member 40 and circuit block 20 is then fitted to the housing 10, with the circuit block 20 being accommodated in a cavity 14 of said housing 10. One end of circuit board 21 is set and locked in position by guide members 102 and 103 which are formed on the interior wall of housing 10. A plate spring 22 made of metal such as phosphor bronze is attached to the circuit board 21 and electrically connected to a ground-terminal (not shown) of circuit board 21. This spring 22, in cooperation with said guide members 101 and 102, supports circuit board 21 stably in place and connects the ground-terminal to the metal housing 10 for electrostatic shielding. The cap member 40 is tightly fitted to one end of housing 10 by interference fitting, whereby the first opening 12 is closed. Projections 411 and 412 are guide members for the fitting. A rubber ring 48 is provided to ensure a fluid-tight fitting between housing 10 and cap member 40. A fixing member 80 consisting of a rubber ring 81 and a metal ring 82 is then fixed to the housing 10. Thus, by inserting fixing member 80 into a recess which is defined by a projecting contiguous wall of housing 10 adjacent the second opening 13, the metal ring 82 is tightly fitted into the recess, the rubber ring 81 assisting in an effective closure of the second opening. After circuit block 20 is placed in housing 10, adjusting means 60 including a rotatable member 61 and an engaging member 62 is fixed to housing 10. Thus, the rotatable member 61 with the engaging member 62 is inserted into housing 10 downwardly in perpendicular to circuit board 21 through hole 16 and rotatably fixed to housing 10. A rubber ring 613, shown in FIG. 1, is positioned in a groove 612 for achieving a fluid-tight seal. The engaging member 62 having a general configuration of the capital letter Y, the vertical end portion of which is indicated at 621, is inserted into a slot 611 provided in rotatable member 61. Then, the rotatable member 61 carrying the engaging member 621 is inserted into the housing 10 through hole 16 so that end portion 621 will engage a groove 321 of variable resistor 32. The slot 611 in rotatable member 61 is flared downwardly, i.e. narrower at the upper end than at the lower end, and as the rotatable member 61 is pushed downward, the bifurcated portion of said Y-shaped engaging member 62, as indicated by reference numerals 622 and 623, is deformed to provide a tight joint. The above construction is desirable because it provides for liberal assembling tolerances. In other words, as assembled, adjusting means 60 does not exert a repelling action on circuit board 21 or housing 10. Any other form of adjusting means 60 which comprises an engaging member being slidably fixed to a rotatable member may be adopted. The variable registor 32 can thus be adjusted by rotating the rotatable member 61 with a tool applied to a groove 613.

What is claimed is:

1. A photoelectric switch comprising:
   a housing of opaque material having a first opening at one end thereof and a second opening at another end;
   a circuit board having a lead conductor and shaped to be removably set in said housing through said first opening;
   a hollow fluid-tight sealed cap member secured to said circuit board and removably secured to said housing to thereby close said first opening, said hollow cap member having a window means of transparent material for passing light therethrough;
   a plurality of circuit elements mounted on and electrically connected to said circuit board;
   at least one of a light-emitting element and a light-responsive element disposed within said hollow cap member and electrically connected to said circuit board; and
   a fixing means for securing said lead conductor in position with respect to said housing, with said conductor extending out of the housing, and for closing said second opening.

2. A photoelectric switch as claimed in claim 1, wherein said first opening is larger than said second opening.

3. A photoelectric switch as claimed in claim 1, wherein said cap member is attached to said housing by interference fitting.

4. A photoelectric switch as claimed in claim 1, wherein said housing is made of metal.

5. A photoelectric switch as claimed in Claim 4, wherein said housing is electrically connected to a ground-terminal of said circuit board.

6. A photoelectric switch as claimed in Claim 1, wherein said circuit board is positioned in place by guide members formed inside of said housing.

7. A photoelectric switch comprising:
   a housing of opaque material having a first opening at one end thereof, a second opening at another end thereof and a through-hole in a side-wall thereof;
   a circuit board inserted into said housing through said first opening;
   a fluid-tight sealed cap member, to which one end of said circuit board is fixed and which closes said first opening and is removably fixed to said housing, said cap member further having a window means of transparent material for passing light therethrough;
   a plurality of circuit elements including a variable function electrical element mounted on and electrically connected to said circuit board;
   at least one of a light-emitting element and a light-responsive element placed in a cavity of said cap member and electrically connected to said circuit board;
   an adjusting means inserted into said through-hole in a direction perpendicular to said circuit board and rotatably supported by said housing, one end of said adjusting means being engaged with said variable function electrical element;
   a conductor electrically connected to said circuit board and led out of said housing through said second opening; and
   a fixing means for fixing said conductor to said housing and closing said second opening.

8. A photoelectric switch as claimed in claim 7, wherein said adjusting means comprises a rotatable member and an engaging member, said rotatable member being rotatably attached to said housing and said engaging member being fixed to said rotatable member by sliding engagement.

9. A photoelectric switch as claimed in claim 8, wherein said rotatable member has a slot gradually narrowed from the lower to the upper end and said engaging member has a general configuration of the capital letter Y.

* * * * *